United States Patent [19]
Noda

[11] Patent Number: 5,606,186
[45] Date of Patent: Feb. 25, 1997

[54] SEMICONDUCTOR INTEGRATED CIRCUIT INCLUDING OPPOSED SUBSTRATES OF DIFFERENT SEMICONDUCTOR MATERIALS AND METHOD OF MANUFACTURING THE SEMICONDUCTOR INTEGRATED CIRCUIT

[75] Inventor: Minoru Noda, Itami, Japan

[73] Assignee: Mitsubishi Denki Kabushiki Kaisha, Tokyo, Japan

[21] Appl. No.: 512,916

[22] Filed: Aug. 9, 1995

[51] Int. Cl.⁶ ............. H01L 29/78; H01L 27/06; H01L 27/08; H01L 27/00
[52] U.S. Cl. ............. 257/226; 257/777; 257/67; 257/200; 257/146; 257/278; 257/508; 257/565
[58] Field of Search ............. 257/778, 773, 257/774, 777, 723, 343, 382, 383, 401, 463, 37–39, 67, 96, 97, 105, 146, 200, 195, 189, 196, 187, 278, 279, 289, 523, 508, 505, 742, 272, 226

[56] References Cited

U.S. PATENT DOCUMENTS

| | | | |
|---|---|---|---|
| 4,122,479 | 10/1978 | Sugawara et al. | 257/777 |
| 4,614,960 | 9/1986 | Bluzer | 257/226 |
| 4,889,824 | 12/1989 | Selle et al. | 257/196 |
| 5,041,884 | 8/1991 | Kumamoto et al. | 257/401 |
| 5,168,338 | 12/1992 | Kumada et al. | 257/226 |
| 5,521,401 | 5/1996 | Zamanian et al. | 257/67 |

FOREIGN PATENT DOCUMENTS

| | | | |
|---|---|---|---|
| 264283 | 4/1988 | European Pat. Off. | 257/67 |
| 585059 | 3/1994 | European Pat. Off. | 257/67 |
| 3813837A | 11/1989 | Germany | 257/523 |
| 4239457 | 6/1993 | Germany | 257/508 |
| 56-125868 | 10/1981 | Japan | 257/67 |
| 58-35969 | 3/1983 | Japan | 257/67 |
| 58-124261 | 7/1983 | Japan | 257/67 |
| 59-96761 | 6/1984 | Japan | 257/401 |
| 60-186051 | 9/1985 | Japan | 257/67 |
| 61-196569 | 8/1986 | Japan | 257/67 |
| 61-208253 | 9/1986 | Japan | 257/67 |
| 62-92365 | 4/1987 | Japan | 257/523 |
| 1-168050 | 7/1989 | Japan | 257/67 |
| 4-360570 | 12/1992 | Japan | 257/67 |
| 6-236981 | 8/1994 | Japan | 257/777 |

*Primary Examiner*—Sara W. Crane
*Assistant Examiner*—Alexander Oscar Williams
*Attorney, Agent, or Firm*—Leydig, Voit & Mayer

[57] ABSTRACT

An insulating film having a through hole aligned with an electrode on a first semiconductor element is formed on a first semiconductor substrate and a metal is disposed in the through hole. A second semiconductor element on a second semiconductor substrate is placed on the insulating film in such a way that an electrode of the second semiconductor element contacts the metal. Thus, a plurality of transistors having different performance characteristics and functions can be easily disposed adjacent to each other for improved integration.

13 Claims, 4 Drawing Sheets

SEMICONDUCTOR INTEGRATED CIRCUIT INCLUDING OPPOSED SUBSTRATES OF DIFFERENT SEMICONDUCTOR MATERIALS AND METHOD OF MANUFACTURING THE SEMICONDUCTOR INTEGRATED CIRCUIT

BACKGROUND OF THE INVENTION

1. Field of the Invention

The present invention relates to construction of a semiconductor integrated circuit and a method of manufacturing the same.

2. Background of the Invention

Figure 7:
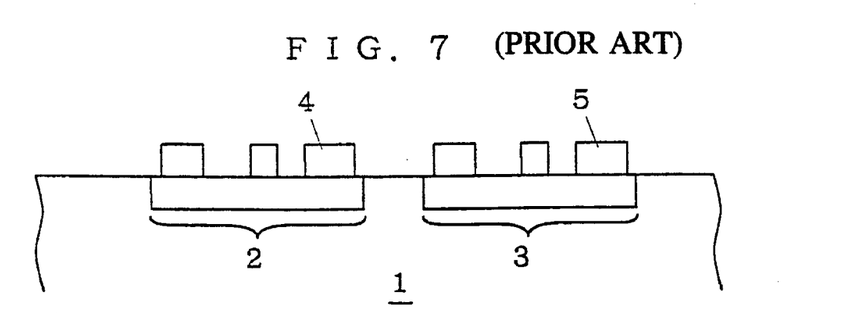
FIG. 7 is a sectional view showing a semiconductor integrated circuit of the first background art.

FIG. 7 is a sectional view showing a first background-art semiconductor integrated circuit, in which a plural number of transistors are arranged on one substrate. In FIG. 7, reference numeral 1 designates a semiconductor substrate, reference numerals 2 and 3 designate a first transistor and a second transistor, respectively, and reference numerals 4 and 5 designate one of the electrodes of the first transistor and one of the electrodes of the second transistor, respectively. The electrodes 4 and 5 of the transistors 2 and 3 are connected to each other by means of metallic wiring and the like, formed by sputtering and the like, to constitute a semiconductor integrated circuit.

Figure 8:
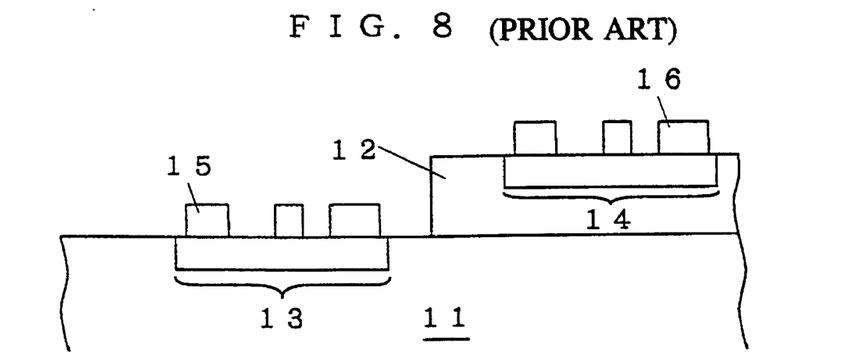
FIG. 8 is a sectional view showing a semiconductor integrated circuit of the second background art.

FIG. 8 is a sectional view showing a second background-art semiconductor integrated circuit. In this semiconductor integrated circuit, a semiconductor region is formed on a semiconductor substrate and another semiconductor layer, and one transistor are formed on the semiconductor substrate and another transistor is formed on the semiconductor region. In FIG. 8, reference numeral 11 designates a semiconductor substrate and reference numeral 12 designates a semiconductor region (well) formed as another semiconductor layer on the top surface of the semiconductor substrate 11, reference numerals 13 and 14 designate a first transistor formed on the semiconductor substrate 11 and a second transistor formed on the semiconductor region 12, respectively, and reference numerals 15 and 16 designate one of the electrodes of the first transistor 13 and one of the electrodes of the second transistor 14, respectively. The electrodes 15 and 16 of the transistors 13 and 14 are connected to each other by means of metallic wiring and the like, formed by sputtering and the like, to constitute a semiconductor integrated circuit.

Figure 9:
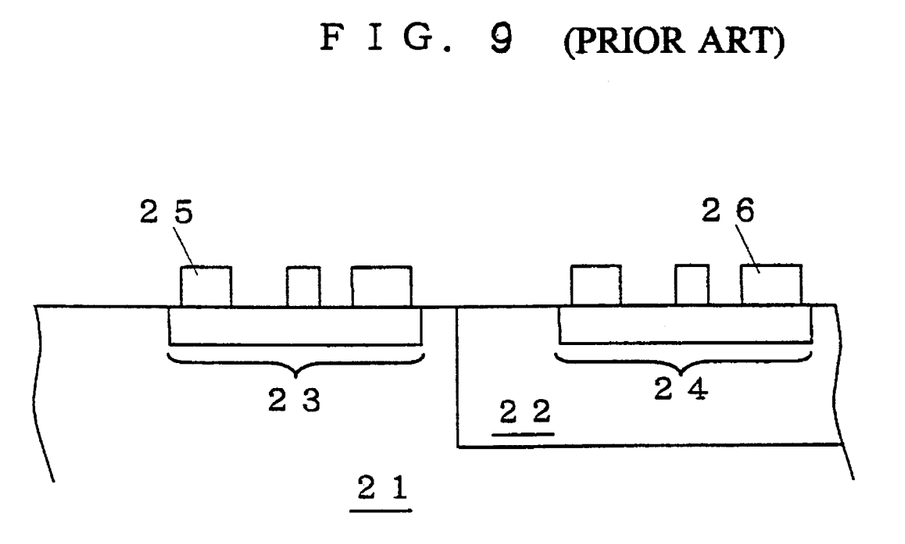
FIG. 9 is a sectional view showing a semiconductor integrated circuit of the third background art.

FIG. 9 is a sectional view showing a third background-art semiconductor integrated circuit. In this semiconductor integrated circuit, a semiconductor region is formed on a semiconductor substrate as another semiconductor layer, and one transistor is formed on the semiconductor substrate and another transistor is formed on the semiconductor region. In FIG. 9, reference numeral 21 designates a semiconductor substrate having a partially recessed part, reference numeral 22 designates a semiconductor region (well) formed as another semiconductor layer in the recessed part of the semiconductor substrate 21, reference numerals 23 and 24 designate a first transistor formed on the semiconductor substrate 21 and a second transistor formed on the semiconductor region 22, respectively, and reference numerals 25 and 26 designate one of the electrodes of the first transistor 23 and one of the electrodes of the second transistor 24, respectively. The electrodes 25 and 26 of the transistors 23 and 24 are connected to each other by means of metallic wiring and the like, formed by sputtering and the like, to constitute a semiconductor integrated circuit.

In the first background art, in which all transistors are formed on one semiconductor substrate, it is difficult to differentiate the performance and function of one transistor from the performance and function of other transistors.

In the second and third background arts, in which semiconductor regions 12, 22 (well) are provided as other semiconductor regions on the same semiconductor substrates 11, 21 where separate transistors 13 and 14, and 23 and 24 all respectively formed, it is possible to make the performance and function of the first transistors 13, 23 different to some extent from the performance and function of the second transistors 14, 24.

In the second and third background arts, however, it is very difficult to form semiconductor regions as other semiconductor layers at any desired position on the semiconductor substrates 11, 21, because of the growth of crystals, processing, and the like of semiconductor regions 12, 22. Specifically, when a GaAs layer as semiconductor regions 12, 22 is grown on Si as semiconductor substrates 11, 21, for example, there are problems such as the production of a high density of dislocations and production of cracks, at a critical film thickness or thicker due to the difference in lattice constants between the two, and this makes it extremely difficult to make good elements on GaAs layers as semiconductor regions 12, 22.

SUMMARY OF THE INVENTION

The present invention is directed to a semiconductor integrated circuit. According to the present invention, the semiconductor integrated circuit comprises: a first semiconductor substrate having a top surface; a first semiconductor element formed on a surface of the first semiconductor substrate; a first electrode formed on a surface of the first semiconductor element; a second semiconductor substrate made of a material different from that of the first semiconductor substrate and arranged in an upper side with respect to the top surface of the first semiconductor substrate; a second semiconductor element formed on a surface of the second semiconductor substrate; a second electrode formed on a surface of the second semiconductor element; an insulating film inserted between the first semiconductor substrate and the second semiconductor substrate; and a conductive material formed from the position of the first electrode to the position of the second electrode in the insulating film.

This makes it possible to form semiconductor elements suitable to the characteristics of the respective materials on respective semiconductor substrates made of materials different from one another and improve their electrical characteristics such as enabling high-speed action of the entire circuit and the like.

Preferably, the second semiconductor substrate is arranged only partially above the first semiconductor substrate.

This will make it possible to form only necessary regions of the second semiconductor substrate, thus enabling reduction of parasitic capacitance.

Preferably, the first semiconductor element is formed on the top surface of the first semiconductor substrate, and the second semiconductor element is formed on a bottom surface of the second semiconductor substrate in a way to face the first semiconductor element.

This will make it possible to shorten the shape of the conductive material as much as possible and reduce the resistance value of the conductive material because what is required is to connect between the first semiconductor element on the upper side of the first semiconductor substrate and the second semiconductor element on the bottom side of the second semiconductor substrate by means of a conductive material. Moreover, at the time of manufacturing, the connecting work becomes extremely easy because electrical continuity between the two is established by just inserting a conductive material between the electrodes of the two semiconductor elements.

Preferably, the first semiconductor substrate is constructed with a silicon member, and the second semiconductor substrate is constructed with a gallium arsenide member.

This will make it possible to prevent the characteristics of the second semiconductor element from being restricted by the characteristics of the silicon member which is the first semiconductor substrate and, when constituting n-type FET element as second semiconductor element, for example, sharply improve its working frequency or electric power efficiency. Moreover, because the separating distance between the two semiconductor elements can be made to agree with the thickness of the insulating film, it becomes possible to shorten the length of the conductive material and reduce the resistance value of the conductive material by forming the insulating film thin in the range in which the parasitic capacitance is sufficiently small.

Preferably, the insulating film has adhesiveness at least on a surface thereof.

This will make it possible to bond the electrodes of the both semiconductor elements between the desired electrodes without producing any displacement.

The present invention is also directed to a method of manufacturing a semiconductor integrated circuit. According to the present invention, the method comprises steps of: forming a first semiconductor element on a surface of a first semiconductor substrate; forming a second semiconductor element on a surface of a second semiconductor substrate made of a material different from that of the first semiconductor substrate; forming a first electrode on a surface of the first semiconductor element; forming a second electrode on a surface of the second semiconductor element; forming an insulating film at least on a surface side of the first semiconductor element and the first electrode; forming a through hole at the position corresponding to the first electrode; filling the through hole with a conductive material; and loading the second semiconductor substrate on the insulating film so that the second electrode on the surface of the second semiconductor element may be in contact with the conductive material.

This will make it possible to form semiconductor elements suitable to the characteristics of the respective materials on each of the semiconductor substrates of materials different from each other and thus improve their electrical characteristics such as enabling high-speed action of the entire circuit, etc.

Preferably, the step of forming the insulating film includes steps of: mixing an adhesive resin into an insulating resin to obtain a mixed resin; and coating the mixed resin at least on the surface side of the first semiconductor element and the first electrode.

This will make it possible to bond the two semiconductor elements to each other through an insulating film and thus bond the electrode of the two semiconductor elements without causing any mutual displacement between electrodes.

Preferably, the first semiconductor substrate is constructed with a silicon member, and the second semiconductor substrate is constructed with a gallium arsenide member.

This will make it possible to prevent the characteristics of the second semiconductor element from being restricted by the characteristics of the silicon member which is the first semiconductor substrate and, when constituting n-type FET element as second semiconductor element, for example, sharply improve its working frequency or electric power efficiency. Moreover, because the separating distance between the two semiconductor elements can be made to agree with the thickness of the insulating film, it becomes possible to shorten the length of the conductive material and reduce the resistance value of the conductive material by forming the insulating film thin in the range in which the parasitic capacitance is sufficiently small.

An object of the present invention is to provide a semiconductor integrated circuit which enables easy arrangement of separate transistors with different performances and functions in the neighborhood of each other and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
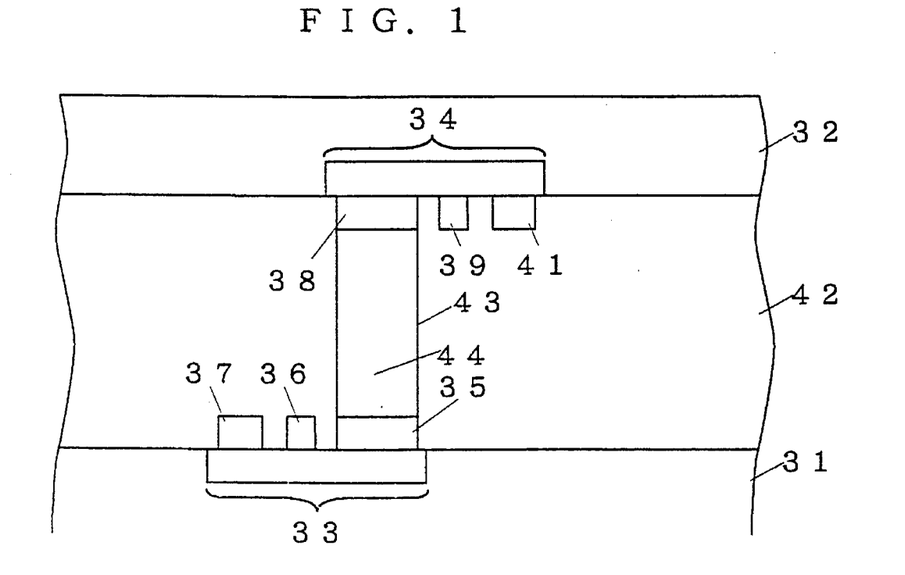
FIG. 1 is a sectional view showing a semiconductor integrated circuit of a first preferred embodiment of the present invention.

FIG. 1 is a sectional view showing a semiconductor integrated circuit of the first preferred embodiment of the present invention. As shown in FIG. 1, the semiconductor integrated circuit of the first preferred embodiment comprises a first semiconductor substrate 31 made of Si, a second semiconductor substrate 32 made of GaAs, a p-type Si-MOSFET element 33 as a first semiconductor element on the top surface of the first semiconductor substrate 31, an n-type GaAs-MESFET element 34 as a second semiconductor element on the bottom surface of the second semiconductor substrate 32, electrodes 35, 36 and 37 of the p-type Si-MOSFET element 33, electrodes 38, 39 and 41 of the n-type GaAs-MESFET element 34, an insulating film 42 realized by mixing an adhesive resin in polyimide resin, a through hole 43 (via hole) penetrating through the insulating film 42 from the top surface to the bottom surface, and a conductive column (via metal) 44 (conductive material) made of a metal such as tungsten filling in the through hole 43.

In the semiconductor integrated circuit, the through hole 43 extends from the position where one electrode (referred to as a first electrode) 35 out of the electrodes 35, 36 and 37 of the p-type Si-MOSFET element 33 is located to the position where one electrode (referred to as a second electrode) 38 out of the electrodes 38, 39 and 41 of the n-type GaAs-MESFET element 34 is located. This makes the conductive column (via metal) 44 in the through hole 43 electrically connect the first electrode 35 of the p-type Si-MOSFET element 33 and the second electrode 38 of the n-type GaAs-MESFET element 34 to each other and, as a result, a complementary logical circuit similar to CMOS is constructed.

Moreover, the insulating film 42 is as thin as possible, to make the separating distance between the first electrode 35 of the p-type Si-MOSFET element 33 and the second electrode 38 of the n-type GaAs-MESFET element 34 as short as possible, within a range that no parasitic capacitance can be produced, and, more specifically, in the range of 1 to 100 μm or so. Thus the vertical length of the conductive column 44 is made as short as possible so as to reduce the resistance value in such parts as much as possible.

Assuming now that the load capacity is the supply voltage is VDD, the current driving capacity of the n-type FET element is βn, the current driving capacity of p-type FET element is βp, and the prescribed constant is αa, the gate delay time td of a logical circuit is generally expressed as $$td = \alpha \cdot (C_L/V_{DD}) \cdot (1/\beta n + 1/\beta p) \quad (1)$$

The current driving capacities βn, βp each represent a dependent coefficient against the gate voltage of the drain current and each has a value expressed as:

$$Ids/(Vgs-Vth)^2$$

where Ids is drain current, Vgs is gate voltage and Vth is threshold value voltage.

When a GaAs-MESFET is the n-type FET element 34, like the second semiconductor element of the first preferred embodiment, the current driving capacity βn of the n-type FET becomes greater compared to a case where an ordinary Si-CMOS is applied. Specifically, a GaAs-MESFET is used in the same environments as where an Si-CMOS is used and the current driving capacity βn is 300 mS/V·mm, for example, the current driving capacity βn can be improved to approximately 600 mS/V·mm maximum. This indicates that, in the case where the load capacity CL, supply voltage VDD and current driving capacity βp of p-type FET element are kept constant, it is possible, from (1), to reduce the gate delay time td of a logical circuit by improving the current driving capacity βn of the n-type FET element. Therefore, it enables speedier action of the semiconductor integrated circuit compared with the first background art in which the n-type FET element is formed on the same semiconductor substrate as the p-type FET element. Furthermore, the first preferred embodiment, in which the thickness of the insulating film 42 is as thin as possible so that no parasitic capacitance is produced, makes it possible to realize speedier operations by making the conductive column 44 short and therefore reducing the resistance of the conductive column 44.

The semiconductor integrated circuit of the above-mentioned construction is manufactured as described below.

Figure 2:
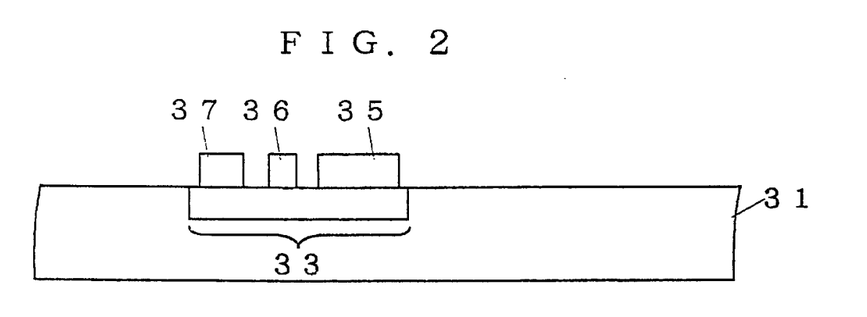
FIGS. 2, 3 and 4 are sectional views showing the process of manufacturing a semiconductor integrated circuit according to the first preferred embodiment of the present invention.

First, as shown in FIG. 2, the p-type Si-MOSFET element 33 as the first semiconductor element is formed on the top surface of the first semiconductor substrate 31 made of Si and, on the top surface of p-type Si-MOSFET element 33, electrodes 35, 36 and 37 are also formed by sputtering and the like. On the other hand, as shown in FIG. 3, the second semiconductor substrate 32 made of GaAs is loaded upside down and, on the top surface thereof, the n-type GaAs-MESFET element 34 as the second semiconductor element is formed by ion implantation and the like, and, on the top surface of the n-type GaAs-MESFET element 34, electrodes 38, 39 and 41 are further formed by vapor deposition and the like.

Figure 4:
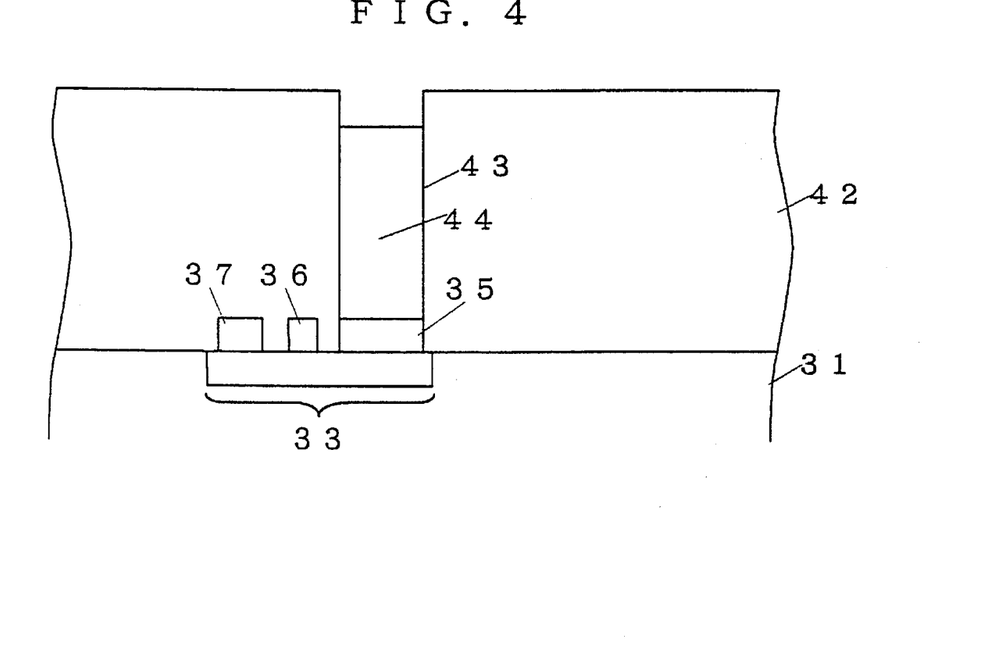

Next, the top surface of the first semiconductor substrate 31 having electrodes 35, 36 and 37 is coated with the mixture of adhesive resin and polyimide resin, produced by mixing the adhesive resin into the polyimide resin, having the prescribed thickness of 1 to 100 μm, and then is subjected to firing to form the insulating film 42. The position corresponding to the first electrode 35 in the insulating film 42 is penetrated in vertical direction by means of etching to form the through hole 43. As shown in FIG. 4, the conductive column 44 is formed by filling the through hole 43 with tungsten and the like by CVD or sputtering.

Figure 3:
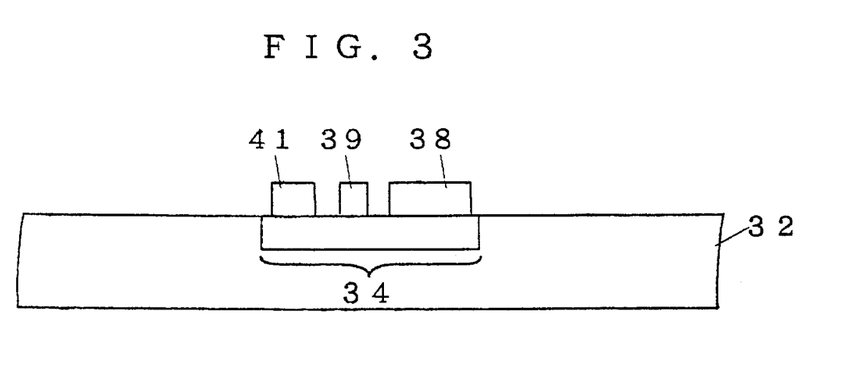

After that, the semiconductor substrate 32 having the n-type GaAs-MESFET element 34 is overturned from the state of FIG. 3, and is put on the top surface of the insulating film 42 in such a way that the second electrode 38 gets in contact with the upper end of the conductive column 44 in the through hole 43, as shown in FIG. 1. At this time, the bonding action becomes quite easy because the insulating film 42 is provided with adhesiveness on the entire part.

As explained above, because a pair of substrates 31, 32 are arranged to face each other and their prescribed electrodes are connected to each other by means of the conductive column 44 in the through hole 43, there is no need for forming any semiconductor region as another semiconductor layer at a desired position of the semiconductor substrates as in the second and third background arts, and this makes it possible to prevent a high density of dislocations due to a difference in lattice constant between the two regions and also to prevent occurrence of crack and the like.

Figure 5:
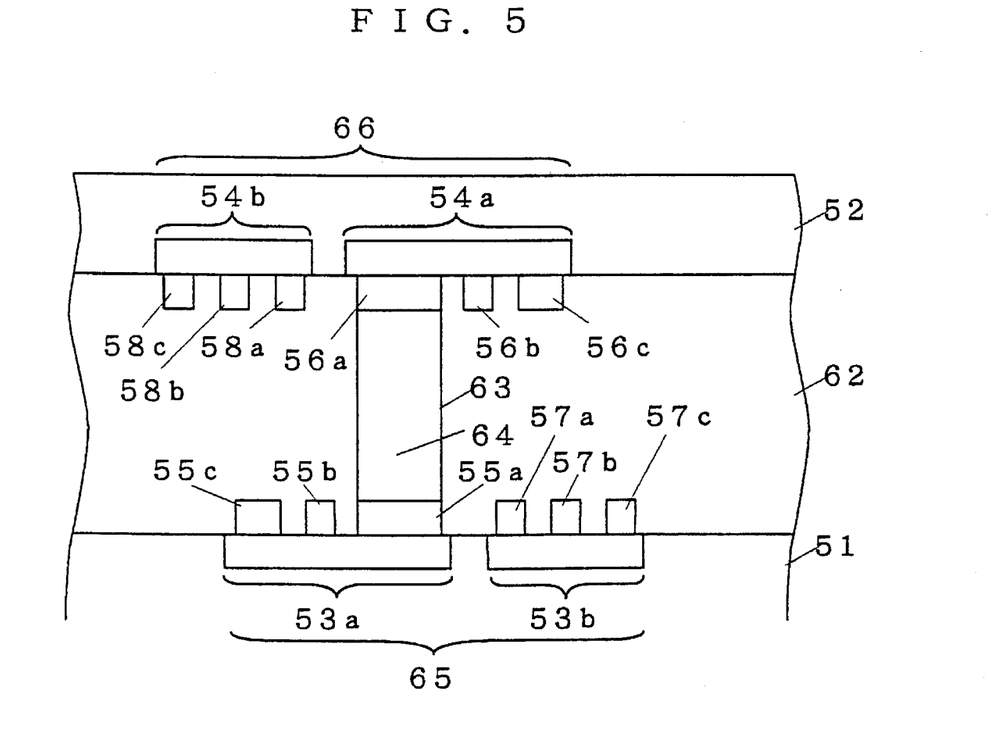
FIG. 5 is a sectional view showing a semiconductor integrated circuit of a second preferred embodiment of the present invention.

FIG. 5 is a sectional view showing a semiconductor integrated circuit of the second preferred embodiment of the present invention.

The semiconductor integrated circuit of the second preferred embodiment comprises, as shown in FIG. 5, a first semiconductor substrate 51 made of Si, a second semiconductor substrate 52 made of GaAs, a first semiconductor element 53a such as n-type Si-MOSFET element or p-type Si-MOSFET element on a portion of the top surface of the first semiconductor substrate 51, a second semiconductor element 54a such as n-type GaAs-MESFET element, p-type GaAs-MESFET element, n-type HEMT, p-type HEMT or HBT on a portion of the bottom surface of the second semiconductor substrate 52, a third semiconductor element 53b such as n-type Si-MOSFET element or p-type Si-MOSFET element located adjacent to the first semiconductor element 53a on the top surface of the first semiconductor substrate 51, a fourth semiconductor element 54b such as n-type GaAs-MESFET element, p-type GaAs-MESFET element, n-type HEMT, p-type HEMT or HBT located adjacent to the second semiconductor element 54a on the bottom surface of the second semiconductor substrate 52, electrodes 55a, 55b and 55c of the first semiconductor element 53a, electrodes 56a, 56b and 56c of the second semiconductor element 54a, electrodes 57a, 57b and 57c of the third semiconductor element 53b, electrodes 58a, 58b and 58c of the fourth semiconductor element 54b, an insulating film 62 made of polyimide resin and adhesive on the surface, a through hole 63 penetrating through the insulating film 62 from the top surface to the bottom surface, a conductive column (via metal) 64 embedded in the through hole 63, Si-IC 65, and GaAs-IC 66.

Here, the through hole 63 extend from the position where one electrode (referred to as a first electrode) 55a out of the electrodes 55a, 55b, 55c of the first semiconductor element 53a is located to the position where one electrode (referred to as a second electrode) 56 out of the electrodes 56a, 56b, 56c of the second semiconductor element 54a is located. This makes the conductive column (conductive material) 64 in the through hole 63 electrically connect the first electrode 55a of the p-type Si-MOSFET element 53a and the second electrode 56a of the second semiconductor element 54a each other. By constructing thus, it becomes possible to construct a complicated semiconductor integrated circuit such as an Si-LSI as the Si-IC 65 and a GaAs-MMIC (monolithic microwave integrated circuit). Especially, while a conventional MMIC has a problem that the surface area of the semiconductor substrate cannot be utilized effectively even when it is desired to also combine other circuits for integration because the surface area of the circuit elements becomes large at frequencies of 1 GHz or under, the MMIC of the second preferred embodiment makes it possible to prepare various circuits on two different semiconductor substrates 51 and 52 and reduce the visible planar surface area of the entire semiconductor integrated circuit by half even when the circuit element has a large surface area, thus eliminating obstacles in the design work.

Figure 6:
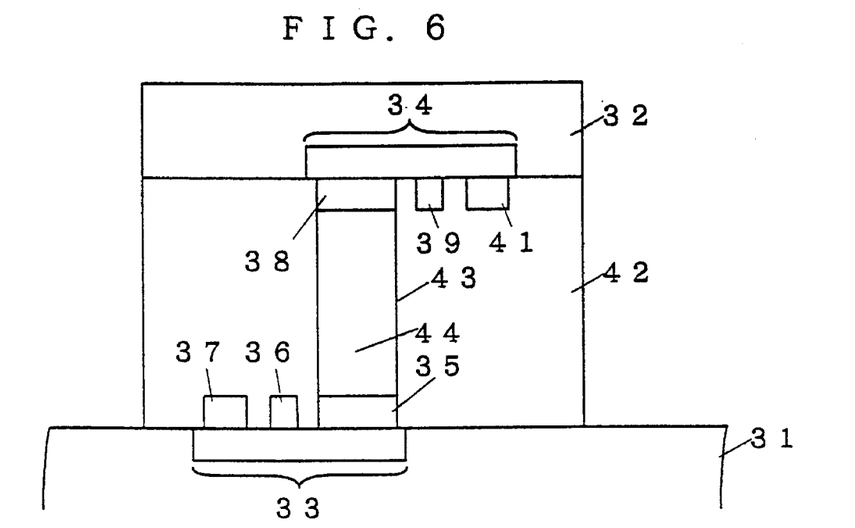
FIG. 6 is a sectional view showing a semiconductor integrated circuit of a third preferred embodiment of the present invention.

FIG. 6 is a sectional view showing a semiconductor integrated circuit of the third preferred embodiment of the present invention.

The semiconductor integrated circuit of the third preferred embodiment is the same as the first preferred embodiment in that the insulating film 42 having the through hole 43 corresponding to the electrode 35 of the first semiconductor element 33 is put on the first semiconductor substrate 31 and that the second semiconductor element 34 under the second semiconductor substrate 32 is loaded on the insulating film 42 in such a way that its electrode 38 corresponds to the through hole 43, but differs from the first preferred embodiment in that the second semiconductor substrate 32 and the insulating film 42 are constructed in a way to partially exist above the first semiconductor substrate 31 in the third preferred embodiment while, in the first preferred embodiment, the second semiconductor substrate 32 was arranged with as large a surface area as that of the first semiconductor substrate 31. Other constructions are the same as those of the first preferred embodiment and, therefore, the members having the same functions are given the same symbols but their explanation is omitted. According to the third preferred embodiment, the second semiconductor substrate 32 is formed only in the necessary region, enabling reduction of parasitic capacitance and the like. Other actions and effects are the same as those of the first preferred embodiment.

(1) In the respective preferred embodiments indicated above, the first semiconductor substrate, which is constructed with a silicon member, and the second semiconductor substrate, which is constructed with gallium arsenide, may also be constructed with materials other than above, such as InP, GainAs, GaSb, GaP, InSb and the like, depending on the characteristic design of the semiconductor elements to be formed. In this way, by changing the materials of the first semiconductor substrate and the second semiconductor substrate, it becomes possible to easily integrate semiconductor elements having different characteristics.

(2) While in the respective preferred embodiments indicated above the insulating film 42 adheres because of mixing with an adhesive resin, it is also possible, in case the adhesion deteriorates, for example, after the firing of the insulating film 42, to apply another thin adhesive insulating film made of the same material on the surface of the insulating film 42 to secure its adhersion. Furthermore, it is also all right to apply a conductive adhesive material only on the surface of the insulating film 42 without mixing any adhesive resin therein.

While the invention has been shown and described in detail, the foregoing description is in all aspects illustrative and not restrictive. It is therefore understood that numerous modifications and variations can be devised without departing the scope of the invention.

What is claimed is:

1. A semiconductor integrated circuit comprising:

a first semiconductor substrate having a top surface;

a first semiconductor element on the top surface of said first semiconductor substrate;

a first electrode on said first semiconductor element;

a second semiconductor substrate made of a material different from said first semiconductor substrate, having a bottom surface, and arranged with the bottom surface opposite the top surface of said first semiconductor substrate;

a second semiconductor element on the bottom surface of said second semiconductor substrate;

a second electrode on said second semiconductor element;

a solid electrically insulating film disposed between and contacting both the top surface of said first semiconductor substrate and the bottom surface opposite said second semiconductor substrate; and an electrical conductor extending through said insulating film from and connecting the first electrode to the.

2. The semiconductor integrated circuit in accordance with claim 1, wherein said second semiconductor substrate is arranged opposite only part of said first semiconductor substrate.

3. The semiconductor integrated circuit in accordance with claim 1, wherein said first semiconductor substrate is silicon, and said second semiconductor substrate is gallium arsenide.

4. A method of manufacturing a semiconductor integrated circuit comprising:

forming a first semiconductor element on a first surface of a first semiconductor substrate;

forming a second semiconductor element on a first surface of a second semiconductor substrate made of a material different from the first semiconductor substrate;

forming a first electrode on said first semiconductor element;

forming a second electrode on said second semiconductor element;

forming a solid electrically insulating film on and in contact with the first surface of said first semiconductor substrate and said first electrode;

forming a through hole in said insulating film at a position aligned with said first electrode;

filling the through hole with an electrically conductive material contacting said first electrode; and placing said second semiconductor substrate on and in contact with said insulating film so that said second electrode contacts said electrically conductive material.

5. The method of manufacturing a semiconductor integrated circuit in accordance with claim 4, wherein:

forming said insulating film includes mixing an adhesive resin and an insulating resin to obtain a mixed resin; and applying said mixed resin to said first surface of said first semiconductor substrate and said first electrode.

6. The method of manufacturing a semiconductor integrated circuit in accordance with claim 4, wherein said first semiconductor substrate is silicon, and said second semiconductor substrate is gallium arsenide.

7. The semiconductor integrated circuit in accordance with claim 1, wherein said insulating film includes a polyimide resin.

8. The semiconductor integrated circuit in accordance with claim 1, wherein said insulating film has a thickness ranging from 1 to 100 microns.

9. The method of manufacturing a semiconductor integrated circuit in accordance with claim 4 including forming said insulating film of a polyimide resin.

10. The method of manufacturing a semiconductor integrated circuit in accordance with claim 5, wherein said insulating resin is a polyimide resin.

11. The method of manufacturing a semiconductor integrated circuit in accordance with claim 4 including forming said insulating film to a thickness within a range of 1 to 100 microns.

12. The method of manufacturing a semiconductor integrated circuit in accordance with claim 5 including, after applying said mixed resin, firing said mixed resin.

13. The method of manufacturing a semiconductor integrated circuit in accordance with claim 4 including, after filling the through hole and before placing said second semiconductor substrate on said insulating film, applying an adhesive layer to said insulating film.

* * * * *

UNITED STATES PATENT AND TRADEMARK OFFICE
CERTIFICATE OF CORRECTION

PATENT NO. : 5,606,186
DATED : February 25, 1997
INVENTOR(S) : Noda

It is certified that error appears in the above-indentified patent and that said Letters Patent is hereby corrected as shown below:

Column 8, Line 36, after "the" (second occurrence)

insert --second electrode--.

Signed and Sealed this

Seventeenth Day of June, 1997

Attest:

BRUCE LEHMAN

Attesting Officer

Commissioner of Patents and Trademarks